(12) United States Patent
Bains (10) Patent No.: US 7,810,013 B2
(45) Date of Patent: Oct. 5, 2010

(54) MEMORY DEVICE THAT REFLECTS BACK ERROR DETECTION SIGNALS

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 1070 days.

(21) Appl. No.: 11/479,568

(22) Filed: Jun. 30, 2006

(65) Prior Publication Data

US 2008/0022187 A1    Jan. 24, 2008

(51) Int. Cl.
*H03M 13/00* (2006.01)
(52) U.S. Cl. .................. 714/758; 714/763; 711/169; 711/140; 711/167; 711/158
(58) Field of Classification Search .............. 714/758, 714/763; 711/140, 167–169; 710/52
See application file for complete search history.

(56) References Cited

U.S. PATENT DOCUMENTS

| 5,603,010 | A | 2/1997 | Dodd et al. |
| 5,956,753 | A | 9/1999 | Glew et al. |
| 6,625,707 | B2 | 9/2003 | Bormann |
| 6,895,527 | B1 | 5/2005 | Quach et al. |
| 6,993,633 | B1 | 1/2006 | Sakakibara et al. |
| 2005/0108465 | A1 | 5/2005 | Vogt |
| 2005/0108490 | A1 | 5/2005 | Vogt |
| 2005/0108611 | A1 | 5/2005 | Vogt |
| 2007/0162825 | A1* | 7/2007 | Wang et al. ............... 714/763 |

* cited by examiner

*Primary Examiner*—Sam Rizk
(74) *Attorney, Agent, or Firm*—Blakely, Sokoloff, Taylor & Zafman LLP (57) ABSTRACT

In some embodiments, a chip includes a memory core, a write buffer, transmitters, receivers to receive groups of signals including write data signals and associated error detection signals, and circuitry to provide the error detection signals to the transmitters to be transmitted to another chip and to provide the write data signals to the write buffer. The write data signals are held in the write buffer at least until it is determined whether their associated transmitted error detection signals match corresponding error detection signals stored in the other chip. Other embodiments are described and claimed.

27 Claims, 7 Drawing Sheets

Write data header

| | 0 | 1 | 2 | 3 | 4 | 5 | 6 | 7 | 8 |
|---|---|---|---|---|---|---|---|---|---|
| 0 | WD0=1 | 0 | 1 | 2 | 3 | 4 | 5 | CRC | CRC |
| 1 | 6 | 7 | 8 | 9 | 10 | 11 | 12 | 13 | CRC |
| 2 | s0 | 14 | 15 | 16 | 17 | 18 | 19 | 20 | CRC |
| 3 | s1 | 64 | 65 | 66 | 67 | 68 | 69 | 70 | CRC |
| 4 | 71 | 72 | 73 | 74 | 75 | 76 | 77 | 78 | CRC |
| 5 | WD1=0 | 79 | 80 | 81 | 82 | 83 | 84 | CRC | CRC |

FIG. 7

Write data frame 1

| | 0 | 1 | 2 | 3 | 4 | 5 | 6 | 7 | 8 |
|---|---|---|---|---|---|---|---|---|---|
| 0 | WD0=1 | 21 | 22 | 23 | 24 | 25 | 26 | CRC | CRC |
| 1 | 27 | 28 | 29 | 30 | 31 | 32 | 33 | 34 | CRC |
| 2 | Wme=0 | 35 | 36 | 37 | 38 | 39 | 40 | 41 | CRC |
| 3 | | 85 | 86 | 87 | 88 | 89 | 90 | 91 | CRC |
| 4 | 92 | 93 | 94 | 95 | 96 | 97 | 98 | 99 | CRC |
| 5 | WD1=1 | 100 | 101 | 102 | 103 | 104 | 105 | CRC | CRC |

FIG. 8

Write data frame 2

| | 0 | 1 | 2 | 3 | 4 | 5 | 6 | 7 | 8 |
|---|---|---|---|---|---|---|---|---|---|
| 0 | WD0=1 | 42 | 43 | 44 | 45 | 46 | 47 | CRC | CRC |
| 1 | 48 | 49 | 50 | 51 | 52 | 53 | 54 | 55 | CRC |
| 2 | 56 | 57 | 58 | 59 | 60 | 61 | 62 | 63 | CRC |
| 3 | 106 | 107 | 108 | 109 | 110 | 111 | 112 | 113 | CRC |
| 4 | 114 | 115 | 116 | 117 | 118 | 119 | 120 | 121 | CRC |
| 5 | WD1=1 | 122 | 123 | 124 | 125 | 126 | 127 | CRC | CRC |

|   | 0 | 1 | 2 | 3 | 4 | 5 | 6 | 7 | 8 |
|---|---|---|---|---|---|---|---|---|---|
| 0 | e[53] | e[42] | e[41] | e[30] | e[29] | e[18] | e[17] | C[6] | C[5] |
| 1 | e[52] | e[43] | e[40] | e[31] | e[28] | e[19] | e[16] | e[8] | C[4] |
| 2 | e[51] | e[44] | e[39] | e[32] | e[27] | e[20] | e[15] | e[9] | C[3] |
| 3 | e[50] | e[45] | e[38] | e[33] | e[26] | e[21] | e[14] | e[10] | C[2] |
| 4 | e[49] | e[46] | e[37] | e[34] | e[25] | e[22] | e[13] | e[11] | C[1] |
| 5 | e[48] | e[47] | e[36] | e[35] | e[24] | e[23] | e[12] | C[7] | C[0] |

MEMORY DEVICE THAT REFLECTS BACK ERROR DETECTION SIGNALS

BACKGROUND

1. Technical Field

Some embodiments of the inventions relate to memory devices that reflect back error detection signals such as cyclic redundancy check (CRC) checksums.

2. Background Art

Various arrangements for memory devices in a memory system have been proposed. For example, in a traditional synchronous dynamic random access memory (DRAM) system, memory devices communicate data through bidirectional data buses and receive commands and addresses through command and addresses buses. In some implementations, the memory devices have stubs that connect to the buses in a multi-drop configuration. Other designs include point-to-point signaling. Bidirectional signaling may be sequential or simultaneous.

Various error detection techniques have been used. Cyclic redundancy check (CRC) is a well know procedure wherein a checksum is produced from a large number of bits. The checksum is used to detect errors after transmission or storage. The checksum is calculated and appended to data before transmission or storage. The checksum of the data is recalculated later and compared with the appended checksum. If the original and later calculated checksums do not match, there is reason to doubt the accuracy of the data or a command contained in the data. Various responses can be made such as resending the data. There are a variety of types of CRC procedures and recovery methods. Some of the error detection techniques, such as error correcting code (ECC), involve error correction techniques.

As speeds of interconnect signaling increase, the bit error rate (BER) may also increase. CRC procedures have been proposed for use in memory systems including DRAM memory systems. The checksums can be recalculated in the DRAM and compared with the received checksum. Write data can stay in a posted write buffer until a match is determined. The system can respond in various ways if there is not a match including ignoring certain data, resending certain data, including chains of commands, perform ECC, reinitializing a link, and/or reinitializing a portion of a memory core.

Improving error coverage on write data to a DRAM memory device could be accomplished with stronger CRC codes and a significant amount on logic in the DRAM memory device to generate CRC.

Memory controllers provide various commands to memory devices. These commands include a precharge command (PRE), an activate command (ACT), a read command (RD), and a write command (WR). Some commands come in chains over time in which some commands follow other commands in a progression (for example, PRE, ACT, CAS). Read and write commands are sometimes called CAS commands. There are many variations on these commands. Some compound commands from memory controllers are divided into sub-commands by the memory device. For example, a combined ACT/RD command, is divided into an ACT command and a RD command by the memory device.

Commands, addresses, write data, and read data have been transmitted in a variety of forms including packets and frames. Frames are a type of packet in which signals on parallel lanes are provided in a particular number of unit intervals (UI).

Memory modules include a substrate on which a number of memory devices are placed. A dual in-line memory module (DIMM) is an example. In some systems, a buffer is also placed on the substrate. For at least some signals, the buffer interfaces between the memory controller (or another buffer) and the memory devices on the module. In such a buffered system, the memory controller can use different signaling with the buffer than the buffer uses with the memory devices. Multiple modules may be in series and/or parallel. There may be one memory device in a chip or more than one memory device in a chip. Chips may be in stacks.

Some computer systems having included some memory devices on a motherboard and other memory devices on a memory module or other card in a connector on the motherboard.

In some memory systems, the memory devices receive signals and repeat them to other memory devices as well as provide requested data signals to next memory devices. Read data signals can be provided to the memory controller through a point-to-point unidirectional return link from the last memory device in a series of memory devices in a looped fashion or from a memory device that is not the last memory device in the series.

Memory controllers have been used in chipset hubs and in a chip that includes a processor core. Some computer systems include wireless transmitter and receiver circuits.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

In some embodiments, a memory device receives write data signals and associated error detection signals (such as CRC checksums) from a memory controller. The memory device reflects (returns) the error detection signal back to the memory controller for the memory controller to determine whether the returned error detection signal matches a stored error detection signal. This procedure avoids having circuitry on the memory device to calculate error detection signals from the received write data and compare the received error detection signals with the locally calculated error detection signals. Instead, a copy of the error detection signals calculated in the memory controller is stored in the memory controller and compared with the returned error detection signal. An indication is provided in the memory device as to whether there was a match of error detection signals. The indication may be a signal or the absence of a signal within a particular time. Error coverage on writes may be further improved by having a rolling checksum across multiple frames. The rolling checksum is calculated from bits in multiple frames and is stored in multiple frames.

Figure 1:
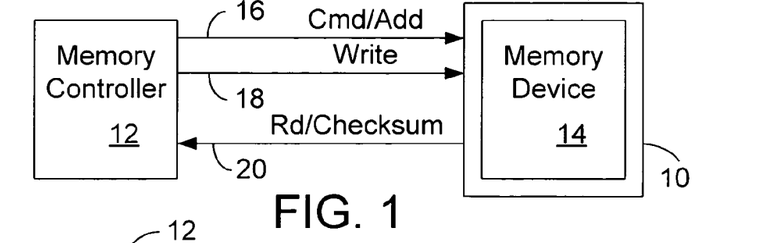
FIG. 1 is a block diagram representation of a memory system including a memory controller and memory device accordingly to some embodiments.

Referring to FIG. 1, a system includes a memory controller 12 that interfaces with a memory device 14 through a link 16, a link 18, and a link 20. Link 16 carries command and address signals from memory controller 12 to memory device 14. Link 18 carries write data signals from memory controller 12 to memory device 14. In some embodiments, write commands are carried on link 16 and in other embodiments, write commands are carried on link 18. Link 20 carries read data signals and, as explained below, also carries CRC checksum signals from memory device 12 to memory controller 14. The CRC checksum signals are from write data signals provided by memory controller 12 to memory device 14, although an error may cause a returned checksum to be corrupted. In the example of FIG. 1, links 16, 18, and 20 are used unidirectionally, but in other embodiments, one or more of the links could be bidirectional. Links 16, 18, and 20 may each include multiple lanes. Memory device 14 is part of a chip 10, which may be essentially only a memory chip or which may perform other significant functions such as processing, moving signals between other chips, and communication functions.

Figure 7:
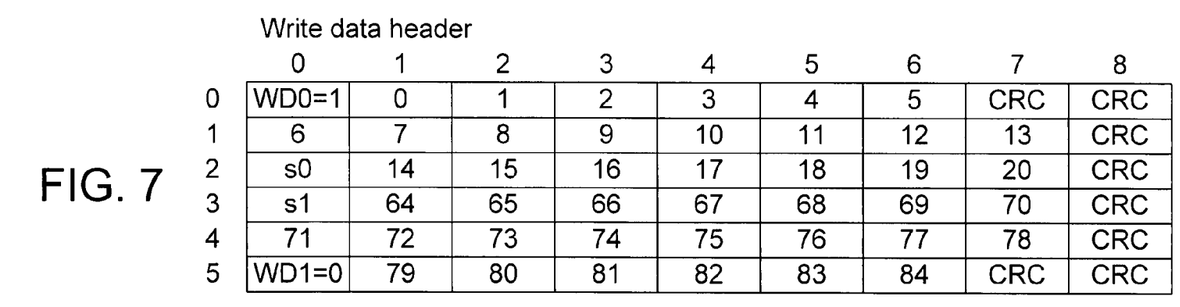
FIGS. 7-9 are each a graphical representation of a frame that may be used in some embodiments of the inventions.
Figure 8:
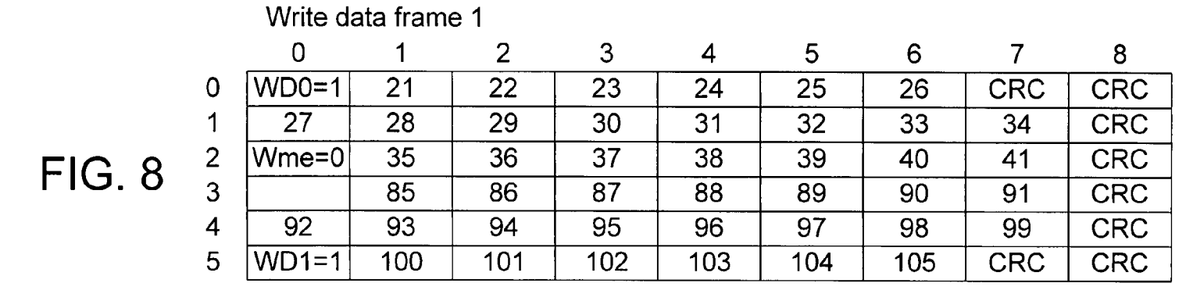
Figure 9:
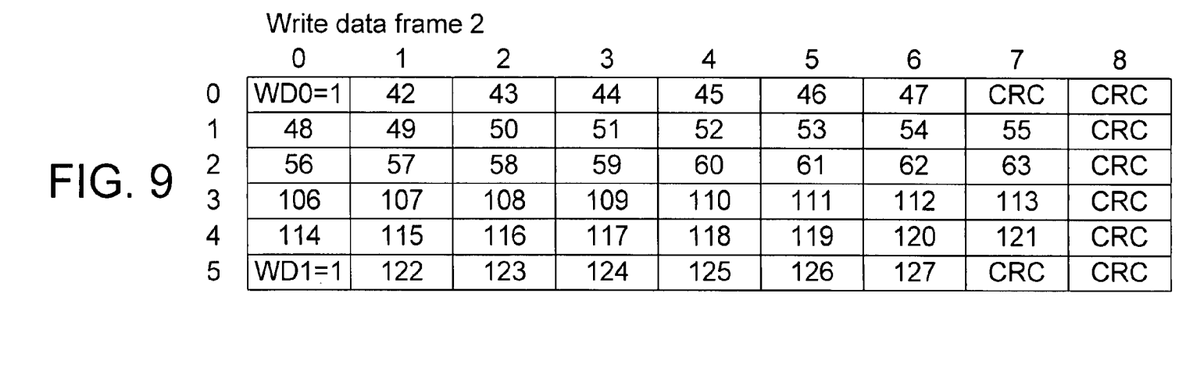

The command and address signals and the write data signals may be provided in groups of signals. Examples of the groups include frames and packets. As noted, a frame is a type of packet. CRC checksums may be part of the groups of signals or provided elsewhere. FIGS. 7-9 provide examples of a write data header frame, a write data frame 1, and a write data frame 2. The frames of FIGS. 7-9 are six bits in width carried on six lanes (0, 1, 2, 3, 4, 5, and 6) and the frame lasts nine unit interval (UI) transfers (0, 1, . . . 8), although the frame could involve more or less than six lanes and more or less nine UI transfers. As an example, in the system of FIG. 1, lane 18 might have four lanes and in FIG. 4, lane 116 might have eight lanes, but these are not required. The number of UIs might be more, stay the same, or be less if the number of lanes is different. Each frame of FIGS. 7-9 includes 8 bits CRC checksum code that covers 46 bits of data payload in the frames. In this example, checksum bits are included in lanes 0 and 5 in UI 7 and in lanes 0-5 of UI 8, but the bits could be in other positions in the frame. The inventions do not require the details of the frames of FIGS. 7-9 or the use of any frames. Although the symbols in FIGS. 7-9 are not required, the following is an explanation of them. If a frame has lane 0 of UI 0=1 and lane 5 of UI 0=0, the frame is a write data header frame (as in FIG. 7). The bits in lane 2 and 3 of UI 0 are chip select bits (s0 and s1) for the write data header frame. If the frame has lane 0 of UI 0=1 and lane 5 of UI 0=1, the frame is a write data frame (as in FIGS. 8 and 9). The bit (Wme=0) at lane 2 of UI 0 indicates it is write data frame 1. The other numbered bits 0-127 in FIGS. 7-9 represent sixteen bytes of write data. Note that in FIGS. 7-9, bits 0-63 are in lanes 0-2 of the three frames and bits 64-127 are in lanes 3-5 of the three frames. Although the following discussion involves frames, the invention could be implemented with other groups of signals.

Figure 2:
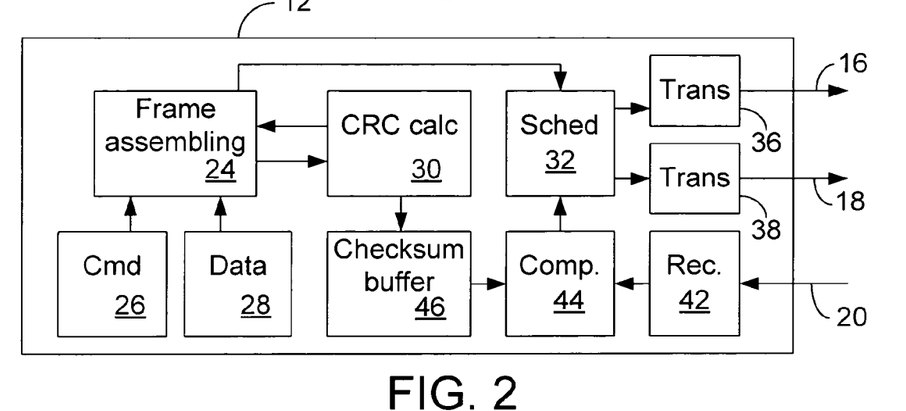
FIG. 2 is a block diagram representation of some details of the memory controller of FIG. 1 accordingly to some embodiments.

FIG. 2 illustrates some embodiments of memory controller 12 of FIG. 1, although the inventions are not limited to these details. The functions can be performed somewhat differently than shown in FIG. 2. In FIG. 2, memory controller 12 includes frame assembling circuitry 24 to assemble partial frames from commands and data received from command queue 26 and data buffer 28. CRC checksum calculation circuitry 30 receives some of the bits to be included in a frame and calculates a checksum from these bits. For example, the bits may be write data or write data plus associated control bits to be in the same frame. A copy of the checksum is provided to frame assembling circuitry 24 to be included in the frame. A copy of the checksum is also provided to checksum buffer 46 for later comparison with a returned checksum. The completed frame is provided by frame assembling circuitry 24 to scheduling circuitry 32. Scheduling circuitry 32 provides frames with commands and addresses to transmitters 36 which transmits them to link 16, and frames with write data signals to transmitters 38 which transmits them to link 18.

As explained in connection with FIG. 3, some checksums provided by memory controller 12 to memory device 14 are returned by memory device 14 through link 20 to receivers 42 of memory controller 12. In some embodiments, the checksums may be returned in frames that have bits that indicate they include returned checksums. The returned checksums are compared in comparison circuitry 44 with checksums stored in buffer 46 that correspond to the frame that contained the returned command. In other words, when a checksum is created for frame X, a copy of the checksum in frame X is provided in buffer 46 with some way of associating it with the checksum returned from frame X by memory device 14. There are various ways in which the checksum in buffer 46 can be associated with the checksum being returned from memory device 14. In some embodiments, there are some additional signals provided with the returned checksums that identifies the frame they were associated with. Scheduling circuitry 32 may also provide bits to buffer 46 to identify the stored checksums with particular frames. In other embodiments, scheduling circuitry 32 handles scheduling of frames in a predictable manner and memory device 14 handles returns on checksums in a predictable manner so that memory controller 12 will know which checksum in buffer 46 corresponds to which returned checksums.

In some embodiments, the write data is transmitted by memory controller 12 before the write command (CAS) is transmitted. In such some embodiments, scheduling circuitry 32 can wait until after comparison circuitry 44 indicates the stored and returned checksums match to provide the write command to transmitters 36 or 38 for transmission to memory device 14. The reception of the write command by memory device 14 indicates a match. A different signal may be sent (or bits in a frame with an additional purpose) may be sent to indicate a mismatch. In other embodiments, a signal is provided only to indicate a checksum mismatch and the absence of a signal after a certain amount of time indicates a match. In still other embodiments, a signal is provided only to indicate a checksum match and the absence of a signal after a certain amount of time indicates a mismatch.

In some embodiments, the read data signals are also provided through link 20. In other embodiments, the read data signals and returned checksum signals are provided on different links.

Figure 3:
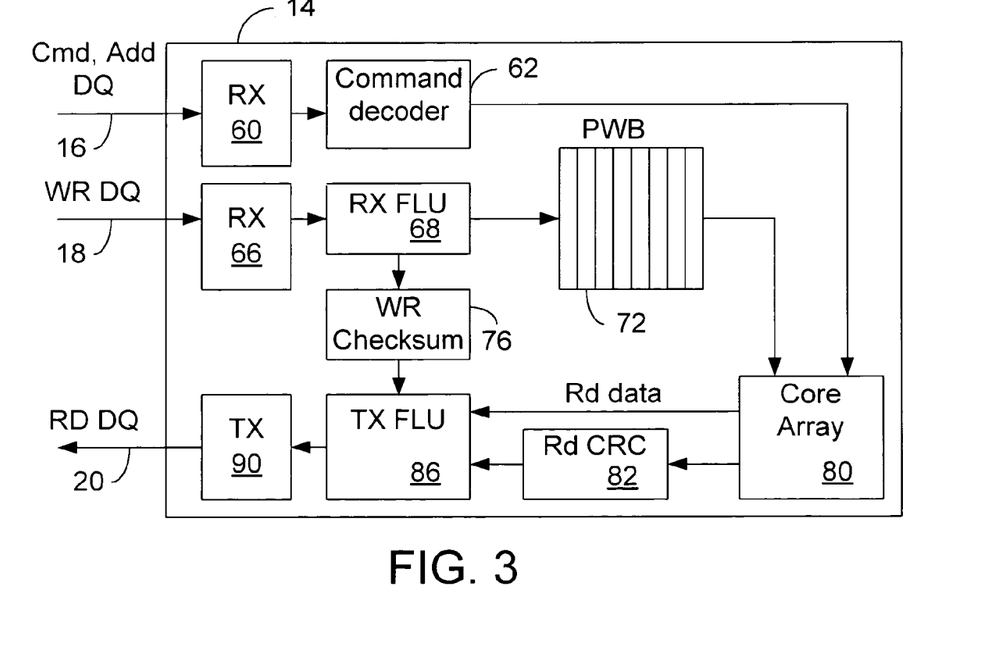
FIG. 3 is a block diagram representation of some details of the memory device of FIG. 1 accordingly to some embodiments.

Referring to FIG. 3, receivers 60 receive frames with command and address signals and associated checksums from link 16. A command decoder 62 receives the frames and provides decoded commands and addresses to memory core array 80. Receivers 66 receives frames of write data from link 18. The received frames are provided to receiver framing logic unit (RX FLU) 68 which extracts the checksums of the frames and provides them to write checksum buffer 76. RX FLU 68 also provides the write data to posted write buffer (PWB) 72. As an example, the entries in PWB 72 may store 128 bits of data or some other amount of data. Write data stay in PWB 72 until it is determined whether the checksum with the write data is valid (returned checksum matches stored checksum from buffer 46) or invalid (returned checksum does not match stored checksum).

In some embodiments, the address for the write frame is provided in a subsequently or previously issued write command. In other embodiments, the address is stored with the write data in PWB 72.

The indication that the checksum is valid could be in a bit or bits in a subsequent frame or command (such as write command) in a subsequent frame. A signal from decoder 62 to PWB 72 may indicate if there is a match. In some embodiments, PWB 72 works on a first-in, first-out basis, except for write data associated with an invalid checksum. In other embodiments, it is not necessarily first-in, first-out.

Read data is provided from core 80 to transmitter framing logic unit (TX FLU) 86 and to read CRC calculating circuitry 82. CRC calculating circuitry 82 calculates a checksum for the read data (and perhaps associated control bits) and provides it to TX FLU 86 which assembles a frame for the read data and checksum. The frame is transmitted by transmitters 90 to link 20. TX FLU 86 also receives the checksums from write checksum buffer 76 and provides them to transmitters 90 for transmitting to memory controller 12 through link 20.

There are several methods possible to generate the frame which reflects the write CRC checksum. The following are some examples for some embodiments, but these are not used in other embodiments.

1. The frame is generated after a fixed delay from the last write data frame (Wd2, FIG. 9). As an example of link 20, a read frame may have 72 bits (8 wide*9 UI). As an example, twenty four of the 72 bit locations are used. It is also possible to use all 72 bits so an unused read frame contains nine write frame worth of checksums.

2. A specific command can be sent on link 16 or 18 to request the write CRC frame to minimize the conflicts with read data frames on link 20.

3. Memory device 14 has intelligence and it monitors read traffic to all ranks including itself. After a fixed delay which is enough to create the write CRC frame, memory device 14 inserts the frame in an idle window on link 20.

Frames received by command decoder 62 may have CRC checksums which may be compared in memory device 14 to checksums recalculated in memory device 14. In some embodiments, the checksums of write commands received by command decoder 62 may be directed to write checksum buffer 76 for transmission to memory controller 12 where they are compared with checksums from buffer 46. In such cases, write data may not be released from write buffer 72 until it is determined that the checksums match. In these embodiments, if there is a match for both the write data and the write command, the write data is released from buffer 72 to core 80. In other embodiments, write commands may be provide on link 16 are issued before write data is provided on link 18 and checksums from the write commands are checked with checksums recalculated in memory device 14. If there is a match for both the write data in memory controller 12 and the write commands in memory device 14, the write data is released from buffer 72 to core 80.

As shown in FIGS. 7-9, the write data sometimes comes in multiple frames. In some embodiments, the checksums for all three frames must match before any of the write data is released.

Figure 10:
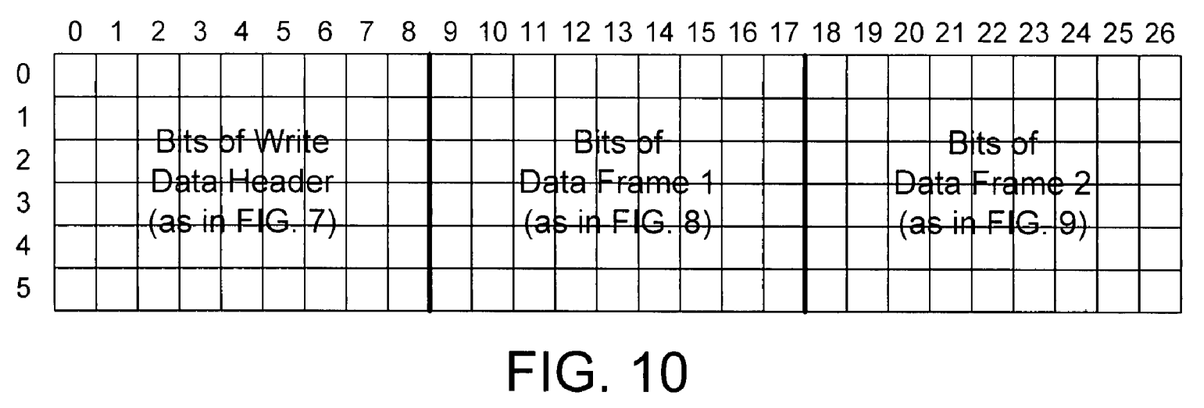
FIG. 10 is a graphical representation of a combination of three frames that may be used in some embodiments of the inventions.
Figure 11:
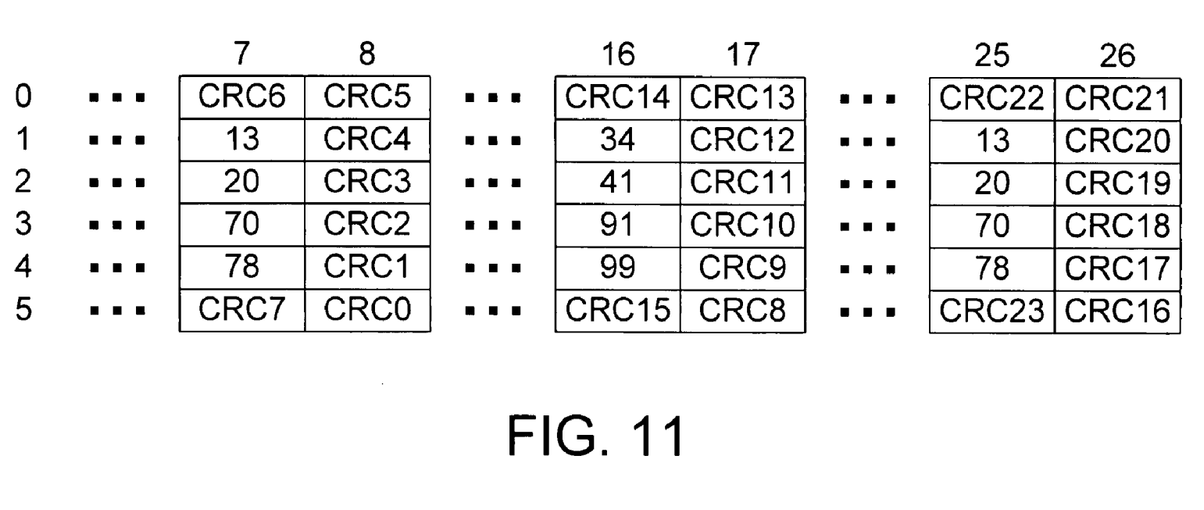
FIG. 11 is a graphical representation of three portions of FIG. 11.

FIG. 10 illustrates a write data transfer of 128 bits across three frames. In some embodiments, each of the three frames of FIG. 10 has an independent 8 bit checksum as in FIGS. 7-9. In other embodiments, the three frames of FIG. 10 have a combined 24 bit checksum. For example, FIG. 11 shows 24 bits of a checksum distributed in the three frames of FIG. 10. This may provide a stronger checksum because 24 bits of CRC checksum are covering 46×3=138 bits of data. Other combinations of CRC checksum bits and data payload can be implemented that give stronger coverage than the implementation of 8 bits covering 46 bits of data as in FIGS. 7-9. In the case of FIG. 11, checksum buffer 46 in FIGS. 2 and 5 can store the combined larger checksum. Because rolling checksums provide much stronger protection, fewer bits per frame may be used.

An adaptive scheme can be implemented to get lower and higher reliability, accessibility, and service (RAS) coverage. In lower RAS, the DRAM or controller computes CRC as 8 bit transmitted per frame for write command but does not need to be reflected back. In higher RAS, a stronger CRC checksum is sent and reflected back to memory controller 12. This scheme can be made adaptive based on error coverage requirements. For example, in a lower RAS mode, a smaller CRC polynomial is used and the logic in DRAM or controller is much smaller in size to compute and check for CRC errors.

There may be various responses to a mismatch. For example, each of the write frames in a group may be resent on link 18 if any of the checksums fail.

The above described examples refer to just returning checksums from memory device 12 to memory controller 14. Alternatively, the entire write data frames could be returned. In some of the alternative embodiments, the checksums could be recalculated from the returned frames and compared with either the returned checksum or the stored checksum or both. In some of these alternative embodiments, buffer 46 is not used, and in other embodiments it is.

Figure 4:
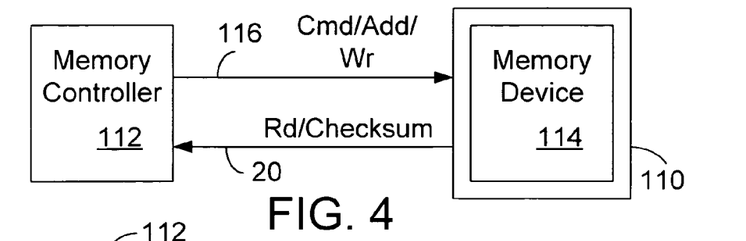
FIG. 4 is a block diagram representation of a memory system including a memory controller and memory device accordingly to some embodiments.

FIG. 4 shows a system similar to that of FIG. 1 except that command, address, and write data signals are transmitted on link 116 from memory controller 112 to memory device 114 in chip 110, which may be similar to chip 10.

Figure 5:
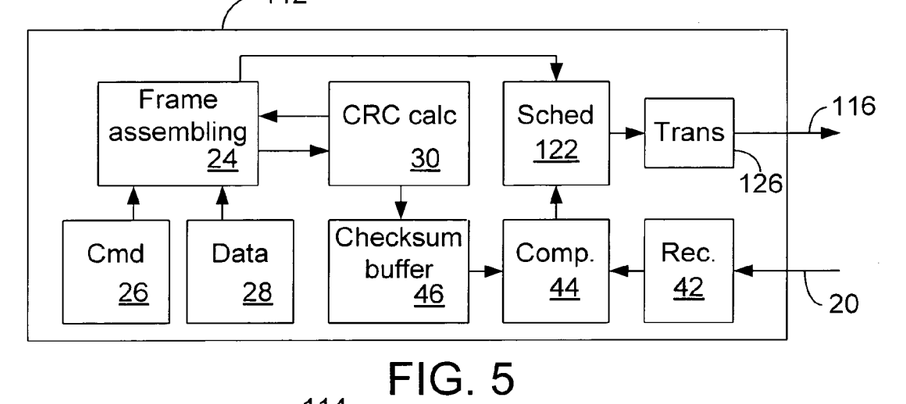
FIG. 5 is a block diagram representation of some details of the memory controller of FIG. 4 accordingly to some embodiments.

FIG. 5 shows details of some embodiments of memory controller 112, which is similar to chip 12 in FIG. 2 except that scheduling circuitry 122 provides commands, addresses, and write data to transmitters 126 which provided them to link 116. Other embodiments of memory controller 112 may have different and additional circuitry.

Figure 6:
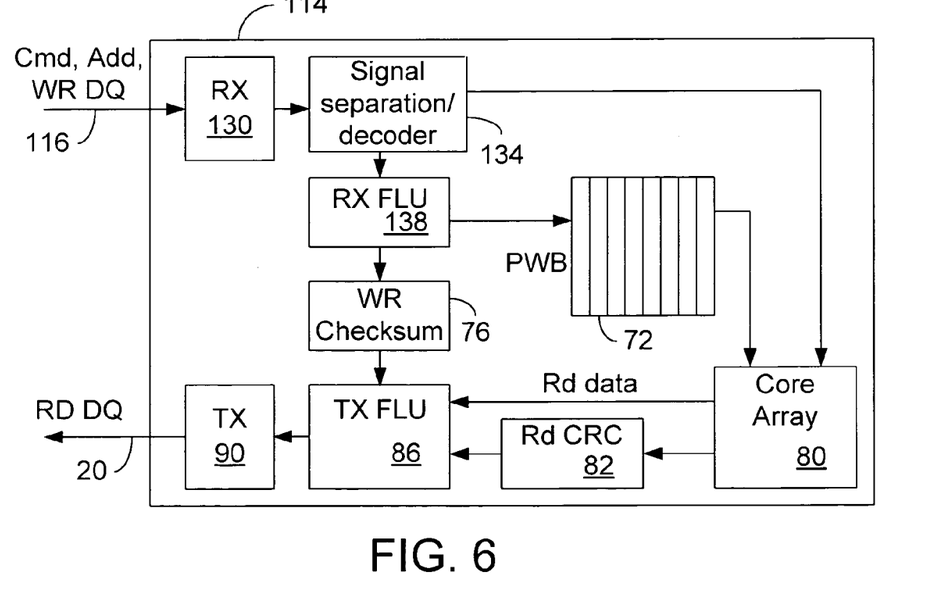
FIG. 6 is a block diagram representation of some details of the memory device of FIG. 4 accordingly to some embodiments.

FIG. 6 shows details of some embodiments of memory device 114, which is similar to memory device 14 in FIG. 3 except as follows. Receivers 130 receives frames including commands, address, and write data and provide them to signal separation and decoder circuitry 134. Separation and decoding circuitry 134 provides write data signals to receiver frame logic unit 138 and provides other commands (such as precharge, activate, and read commands) to core 80. Circuitry 134 provides decoding to at least those signals provided to core 80 and, in some embodiments, also provides some decoding for those signals provided to RX FLU 138. RX FLU 138 provides write data to PWB 72 and provides checksums from write data (and in some embodiments from write commands) to checksum buffer 76.

In different embodiments, there are a variety of ways of memory controllers 12 and 112 responding if there is not a match. Examples include one or more of the following: ignore associated read data, resend a single command, resend a chain of commands, and perform error correction code (ECC), reinitialize a link, and/or reinitialize a portion of a memory core.

Figure 12:
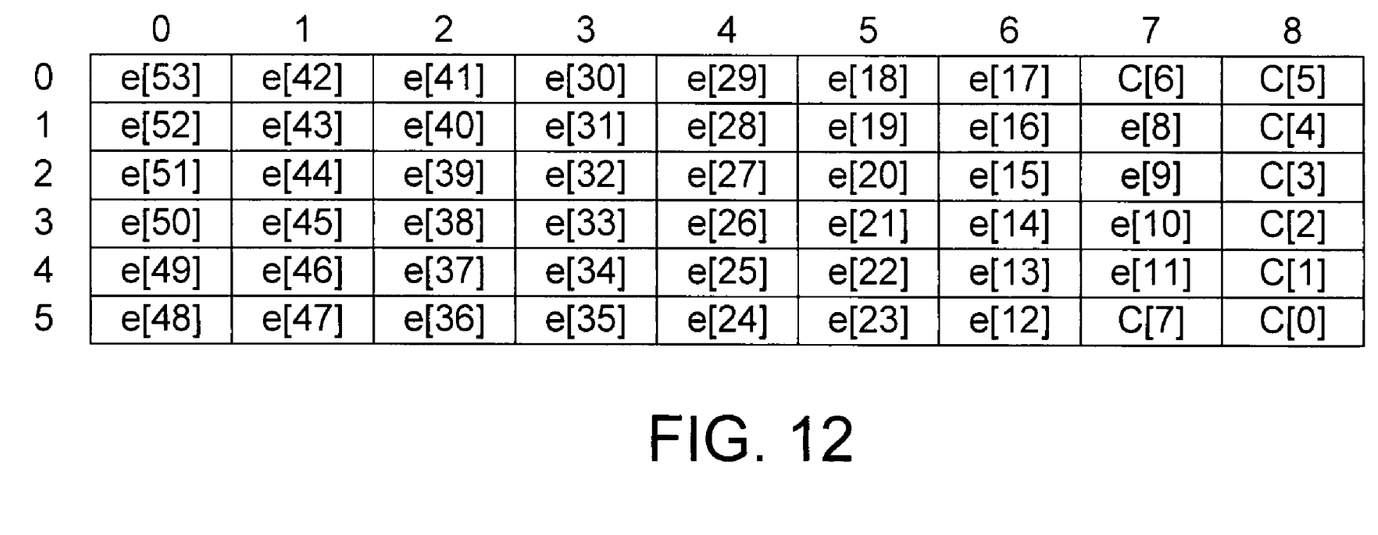
FIG. 12 is a graphical representation of a frame that may be used in some embodiments of the inventions.

The following provides some details on frame and checksum generation that may be used, but is not required to be used. They include standard prior art procedures for generating checksums. As an example, and not a requirement, for CRC generation and checking, the bits in write frames may be processed as a code word represented as a 54 bit vector E[53:0] with a 46 bit payload e[53:8] and an 8 bit CRC checksum C[7:0]:E[53:0]={e[53:8], C[7:0]3}. To enhance error detection capability of the CRC code, the code word may be mapped serpentine-style as shown in FIG. 12.

As an example, but not a requirement, the generator polynomial for the 8 bit CRC may be x8+x5+x3+x2+x+1 (represented in binary as 0b010010111).

As an example, but not a requirement, memory controller 12 and 112 may generate the CRC checksum and form the command and write data frames using an appropriate functional equivalent to the following algorithm:
1. Set E[53:0]={e[53:8], 0b00000000}.
2. Set C[7:0]=the remainder when E[53:0] is divided by 0b010010111.
3. Set E[53:0]={E[53:8], C[7:0]}.

As an example, and not a requirement, memory controller 12 and 112 may check for an error in a received code word E[53:0] using an appropriate functional equivalent to the following algorithm:
1. Set R[7:0]=the remainder when E[53:0] is divided by 0b010010111.
2. If R[7:0]≠0 the received code word contains one or more errors.

Sample Systems

The memory controllers and memory devices described herein may be included in a variety of systems. For example, referring to FIG. 13, chip 404 includes a memory controller 406. Conductors 408-1 . . . 408-M each represent one of more unidirectional or bidirectional interconnects. A memory device may repeat signals to a next memory device. For example, memory devices 410-1 . . . 410-M repeat some signals to memory devices 420-1 . . . 420-M through interconnects 416-1 . . . 416-M. The signals may include command, address, and write data. The signals may also include read data. Read data may be sent directly from memory devices 410-1 . . . 410-M to memory controller 406 through interconnects 408-1 . . . 408-M. However, if read data is repeated from memory devices 410-1 . . . 410-M to memory devices 420-1 . . . 420-M then, in some embodiments, the read data need not be also sent directly from memory devices 410-1 . . . 410-M to memory controller 406. Read data from memory devices 420-1 . . . 420-M may be sent to memory controller 406 through interconnects 418-1 . . . 418-M. Interconnects 418-1 . . . 418-M are not included in some embodiments. Memory devices 410-1 . . . 410-M may be on one or both sides of a substrate 414 of a memory module 412. Memory devices 420-1 . . . 420-M may be on one or both sides of a substrate 424 of a memory module 422. Alternatively, chips including memory devices 410-1 . . . 410-M may be on the motherboard that supports chip 404 and module 424. In this case, substrate 414 represents a portion of the motherboard. The chips may be in stacks.

Figure 13:
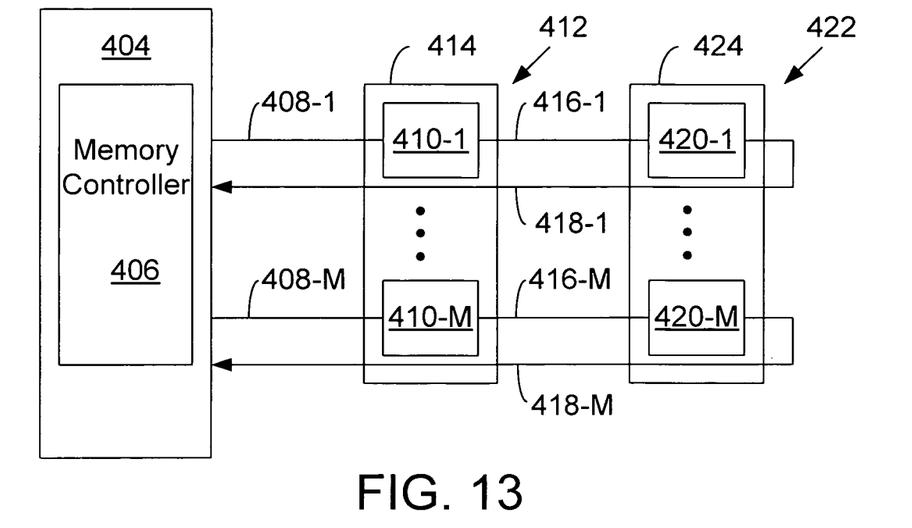
FIGS. 13-17 are each a block diagram representation of a system including a memory controller.

As can be seen in connection with FIG. 13, the write data directed to a particular memory does not necessarily come directed from the memory controller, but may come indirectly by being repeated by another memory device. Likewise, the returned checksum does not necessarily get returned directly to the memory controller, but may be returned indirectly by being repeated to through another memory device. In some embodiments, there are links to directly return the checksums.

Figure 14:
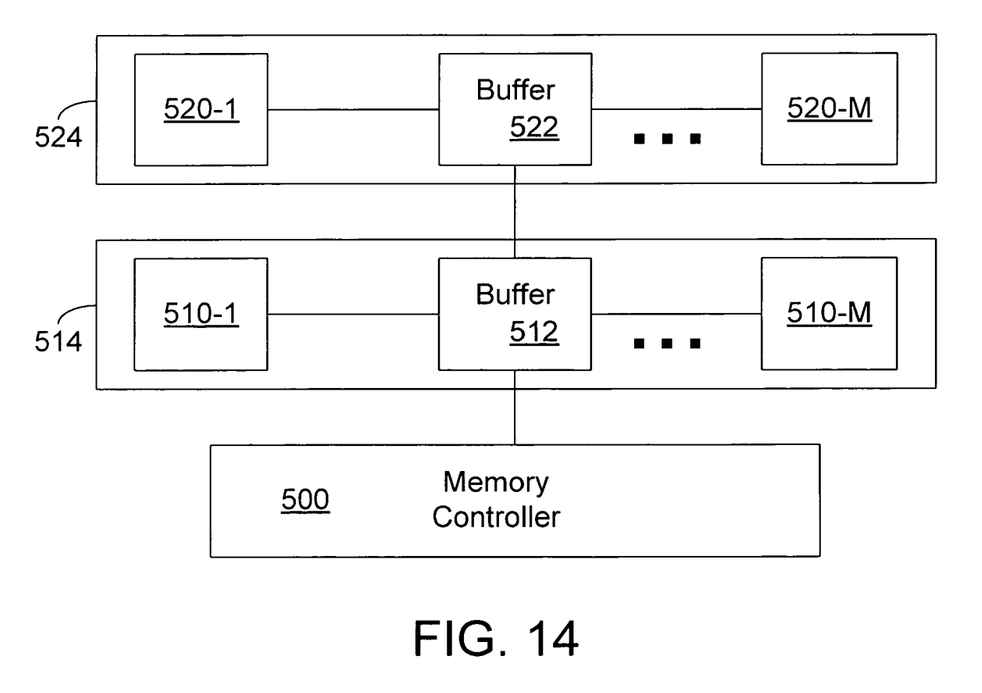

FIG. 14 illustrates a system in which memory chips 510-1 . . . 510-M are on one or both sides of a memory module substrate 514 and memory chips 520-1 . . . 520-M are on one or both sides of a memory module substrate 524. In some embodiments, memory controller 500 and chips 510-1 . . . 510-M communicate to each other through buffer 512, and memory controller 500 and chips 520-1 . . . 520-M communicate through buffers 512 and 522. In such a buffered system, the memory controller can use different signaling with the buffer than the buffer uses with the memory devices. Some embodiments may include additional conductors.

Figure 15:
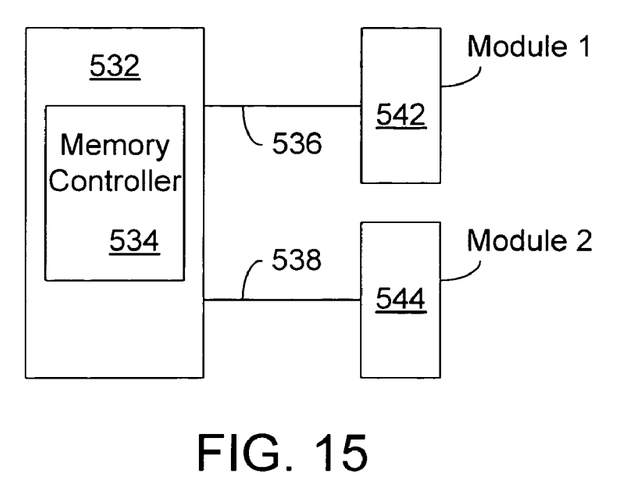

FIG. 15 illustrates first and second channels 536 and 538 coupled to a chip 532 including a memory controller 534. Channels 536 and 538 are coupled to memory modules 542 and 544, respectively, that include chips such as are described herein.

Figure 16:
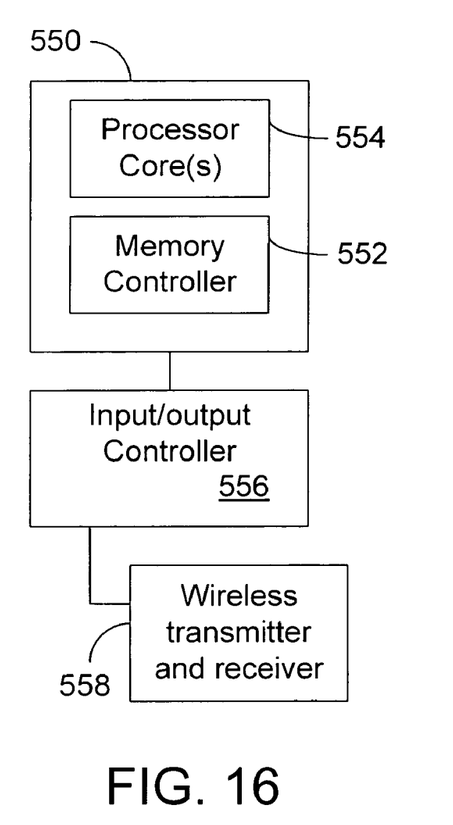
Figure 17:
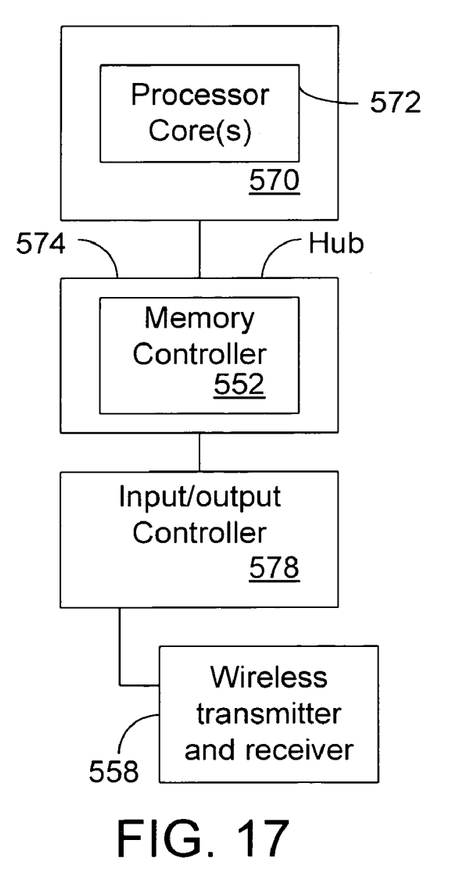

In FIG. 16, a memory controller 552 (which represents any of previously mentioned memory controllers) is included in a chip 550, which also includes one or more processor cores 554. An input/output controller chip 556 (which may be a hub chip) is coupled to chip 550 and is also coupled to wireless transmitter and receiver circuitry 558. In FIG. 17, memory controller 552 is included in a chip 574, which may be a hub chip. Chip 574 is coupled between a chip 570 (which includes one or more processor cores 572) and an input/output controller chip 578, which may be a hub chip. Input/output controller chip 578 is coupled to wireless transmitter and receiver circuitry 558.

Additional Information and Embodiments

In some embodiments, the links can be joined into a single bidirectional link. For example, a bidirectional link could carry some signals that are carried on links 116 and 20 in FIG. 4 or some signals that are carried on some combination of links 16 18, and 20 in FIG. 1.

In some embodiments, the checksum is not returned, but rather a signal representing the checksum is returned.

Receivers 42 of FIG. 2 receive read data signals. Additional circuitry related to processing the read data signals is not shown.

In different embodiments, the links may have different numbers of lanes. For example, link 34 may have six lanes, lane 20 may have eight lanes, link 22 may have one lane, lane 16 may have two lanes, and lane 18 may have four lanes, but a different number of lanes may be used. It may be desirable for the write frames to have at least half the number of lanes as the read frames. Each lane may include only one conductor if signal ended signaling is used or two conductors is differential signaling is used.

A single memory core is shown in the chips, but there could be multiple memory cores.

CRC checksums are only one type of error detection signals that may be used.

The inventions are not restricted to any particular signaling techniques or protocols. For example, the signaling may be single ended or differential. The signaling may include only two voltage levels or more than two voltage levels. The signaling may be single data rate, double data rate, quad data rate, or octal data, etc. The signaling may involve encoded symbols and/or packetized signals. A clock (or strobe) signal may be transmitted separately from the signals or embedded in the signals. Various coding techniques may be used. The inventions are not restricted to a particular type of transmitters and receivers. Various clocking techniques could be used in the transmitters and receivers and other circuits. The receiver symbols in the figures may include both the initial receiving circuits and related latching and clocking circuits. The interconnects between chips each could be point-to-point or each could be in a multi-drop arrangement, or some could be point-to-point while others are a multi-drop arrangement.

In the figures showing one or more modules, there may be one or more additional modules in parallel and/or in series with the shown modules.

In actual implementations of the systems of the figures, there would be additional circuitry, control lines, and perhaps interconnects which are not illustrated. When the figures show two blocks connected through conductors, there may be intermediate circuitry that is not illustrated. The shape and relative sizes of the blocks is not intended to relate to actual shapes and relative sizes.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

When it is said the element "A" is coupled to element "B," element A may be directly coupled to element B or be indirectly coupled through, for example, element C.

When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B."

If the specification states a component, feature, structure, process, or characteristic "may", "might", or "could" be included, that particular component, feature, structure, process, or characteristic is not required to be included. If the specification or claim refers to "a" or "an" element, that does not mean there is only one of the element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising:
a memory core, a write buffer, and transmitters;
receivers to receive groups of signals including write data signals and associated error detection signals; and
circuitry to provide the error detection signals to the transmitters to be transmitted to another chip and to provide the write data signals to the write buffer, wherein the write data signals are held in the write buffer at least until it is determined whether their associated transmitted error detection signals match corresponding error detection signals stored in the other chip.

2. The chip of claim 1, wherein the error detection signals are cyclic redundancy check (CRC) checksums and the groups of signals are frames.

3. The chip of claim 2, wherein some of the checksums stored in the other chip have as many bits as the transmitted checksums for three of the frames.

4. The chip of claim 1, wherein the groups of signals are frames and write data signals are represented in groups of multiple frames, and wherein the write data signals for each of the groups of multiple frames are held in the write buffer at least until it is determined that the associated transmitted error detection signals for each of the multiple frames in the groups match corresponding error detection signals stored in the other chip.

5. The chip of claim 1, wherein error detection signals for write commands are also transmitted to the other chip and compared with corresponding error detection signals, and the write data signals are held in the write buffer at least until it is determined whether the transmitted error detection signals for the write commands match the corresponding error detection signals stored in the other chip.

6. The chip of claim 1, wherein the groups of signals are frames, and write data signals are provided in a group of three frames with each frame having its associated error detection signals being derived only from signals in that frame.

7. The chip of claim 1, wherein the groups of signals are frames, and write data signals are provided in a group of multiple frames with each frame having its associated error detection signals being a portion of a larger group of error detection signals derived from signals in each of the multiple frames.

8. The chip of claim 1, wherein the transmitted error detection signals are a representation of the error detection signals in the received group of signals, but differ from the error detection signals in the received group of signals.

9. The chip of claim 1, wherein some of the groups of signals are related to others of the groups of signals because they carry related write data, and wherein if it is determined that the transmitted error detection signals match the stored corresponding error detection signals and transmitted error detection signals for related groups of signals match stored corresponding error detection signals, then the write data signals are provided from the write buffer to the memory core.

10. The chip of claim 1, wherein the determination that the transmitted error detection signals match stored corresponding error detection signals is made through reception of a write command.

11. The chip of claim 1, wherein the circuitry to provide the error detection signals to the transmitters includes a receiver frame logic unit, a write checksum buffer, and a transmitter frame logic unit, and the write buffer is a posted write buffer.

12. A chip comprising:
circuitry to calculate error detection signals and provide them with associated write data signals to transmitters for transmitting to another chip;
buffers to hold copies of the error detection signals;
receivers to receive error detection signals returned from the other chip; and
comparison circuitry to compare the returned error detection signals with the error detection signals from the buffers.

13. The chip of claim 12, wherein the error detection signals are cyclic redundancy check (CRC) checksums.

14. The chip of claim 12, wherein the write data signals and associated error detection signals are in frames and each of the checksums for each of the write data frames is calculated from bits in that frame.

15. The chip of claim 12, wherein the write data signals and associated error detection signals are in frames and write data signals are presented in groups of three frames and each of the checksums for each of the write data frames is calculated from bits in the three frames.

16. The chip of claim 12, wherein the held error detection signals include error detection signals that are grouped from different frames.

17. The chip of claim 12, wherein the error detection signals are calculated using a cyclic redundancy check (CRC) procedure from at least the write data signals.

18. The chip of claim 12, wherein the error detection signals are calculated from write data signal and additional bits to be in a frame.

19. The chip of claim 12, wherein some of the error detection signals are distributed over multiple groups of three frames are treated as one group of error detection signals.

20. A system comprising:
a first chip including:
circuitry to calculate error detection signals and provide them with associated write data signals to transmitters for transmitting to a second chip;
buffers to hold copies of the error detection signals;
receivers to receive error detection signals returned from the second chip; and
comparison circuitry to compare the returned error detection signals with the error detection signals from the buffers; and
the second chip including:
a memory core, a write buffer, and transmitters;
receivers to receive groups of signals including write data signals and associated error detection signals; and
circuitry to provide the error detection signals to the transmitters to be transmitted to the first chip and to provide the write data signals to the write buffer, wherein the write data signals are held in the write buffer at least until it is determined whether their associated transmitted error detection signals match corresponding error detection signals stored in the first chip.

21. The system of claim 20, wherein the first chip includes processor cores.

22. The system of claim 20, wherein the first chip is coupled to wireless transmitting and receiving circuitry.

23. The system of claim 20, wherein the error detection signals are cyclic redundancy check (CRC) checksums and the groups of signals are frames.

24. The system of claim 20, wherein some of the checksums stored in the first chip have as many bits as the transmitted checksums for three of the frames.

25. The system of claim 20, wherein the groups of signals are frames and write data signals are represented in groups of multiple frames, and wherein the write data signals for each of the groups of multiple frames are held in the write buffer at least until it is determined that the associated transmitted error detection signals for each of the multiple frames in the groups match corresponding error detection signals stored in the first chip.

26. The system of claim 20, wherein error detection signals for write commands are also transmitted to the first chip and compared with corresponding error detection signals, and the write data signals are held in the write buffer at least until it is determined whether the transmitted error detection signals for the write commands match the corresponding error detection signals stored in the first chip.

27. The system of claim 20, wherein the groups of signals are frames, and write data signals are provided in a group of three frames with each frame having its associated error detection signals being derived only from signals in that frame.

* * * * *